(12) United States Patent
Fuller

(10) Patent No.: US 8,391,809 B1
(45) Date of Patent: Mar. 5, 2013

(54) SYSTEM AND METHOD FOR MULTI-BAND PREDISTORTION

(75) Inventor: Arthur Thomas Gerald Fuller, Carp (CA)

(73) Assignee: FutureWei Technologies, Inc., Plano, TX (US)

( * ) Notice: Subject to any disclaimer, the term of this patent is extended or adjusted under 35 U.S.C. 154(b) by 0 days.

(21) Appl. No.: 13/272,796

(22) Filed: Oct. 13, 2011

(51) Int. Cl.
H04B 1/04 (2006.01)
H04B 1/38 (2006.01)

(52) U.S. Cl. .................. 455/114.3; 455/552.1; 455/561

(58) Field of Classification Search ............... 455/114.3, 455/552.1, 105, 424, 561, 456.5, 114.2, 91, 455/103; 330/149; 375/296
See application file for complete search history.

(56) References Cited

U.S. PATENT DOCUMENTS

| | | | |
|---|---|---|---|
| 6,549,067 B1 * | 4/2003 | Kenington | 330/52 |
| 6,999,523 B2 * | 2/2006 | Posti | 375/296 |
| 7,142,615 B2 * | 11/2006 | Hongo et al. | 375/297 |
| 7,170,344 B2 * | 1/2007 | Suzuki et al. | 330/149 |
| 7,183,847 B2 * | 2/2007 | Suzuki et al. | 330/149 |
| 7,634,238 B2 * | 12/2009 | Suzuki et al. | 455/114.3 |
| 8,294,516 B2 * | 10/2012 | Young et al. | 330/149 |

OTHER PUBLICATIONS

Kim, J., et al., "Digital predistortion of wideband signals based on power amplifier model with memory," IEEE Electronics Letters, Nov. 8, 2001, pp. 1417-1418, vol. 37, No. 23.

Mekechuk, K., et al., "Linearizing Power Amplifiers Using Digital Predistortion, EDA Tools and Test Hardware," tutorial article of Agilent EEs of EDA, Hgh Frequency Electronics, Apr. 2004, 9 pages, Summit Technical Media, LLC.

Morgan, D. R. et al., "A Generalized Memory Polynomial Model for Digital Predistortion of RF Power Amplifiers," IEEE Transactions on Signal Processing, Oct. 2006, pp. 3852-3860, vol. 54, No. 10.

Nezami, M. K., "Fundamentals of Power Amplifier Linearizatin Using Digital Pre-Distortion," High Frequency Electronics, Sep. 2004, 4 pages, Summit Technical Media, LLC.

Ding, L. et al., "A Least-Squares/Newton Method for Digital Predistortion of Wideband Signals," IEEE Transactions on Communicatins, May 2006, pp. 833-840, vol. 54, No. 5.

* cited by examiner

Primary Examiner — Sonny Trinh
(74) Attorney, Agent, or Firm — Slater & Matsil, L.L.P.

(57) ABSTRACT

In an embodiment, a system for multi-band predistortion has a predistortion actuator applying a first and a further adjustable distortion to a first band input and at least one further band input, respectively, based on the first band input and at the least one further band input to provide a first band output and a second band output, respectively. The predistortion actuator drives an output port configured to be coupled to an amplifier. The system further has a processor coupled to an evaluation input, which is couplable to an output of the amplifier. A coefficient calculation block is coupled to a processor output, the first band input, and the at least one further band input. The coefficient calculation block calculates first and the further adjustable distortion coefficients based on the first band input, the at least one further band input and the processor output.

25 Claims, 5 Drawing Sheets

US 8,391,809 B1

SYSTEM AND METHOD FOR MULTI-BAND PREDISTORTION

TECHNICAL FIELD

The present invention relates generally to wireless communication systems, and more particularly to a system and method for multi-band predistortion.

BACKGROUND

Wireless communication systems are widely used to provide voice and data services for multiple users using a variety of access terminals such as cellular telephones, laptop computers and various multimedia devices. Such communications systems can encompass local area networks, such as IEEE 801.11 networks, cellular telephone and/or mobile broadband networks. The communication system can use a one or more multiple access techniques, such as Frequency Division Multiple Access (FDMA), Time Division Multiple Access (TDMA), Code Division Multiple Access (CDMA), Orthogonal Frequency Division Multiple Access (OFDMA), Single Carrier Frequency Division Multiple Access (SC-FDMA) and others. Mobile broadband networks can conform to a number of system types or partnerships such as, General Packet Radio Service (GPRS), 3rd-Generation standards (3G), Worldwide Interoperability for Microwave Access (WiMAX), Universal Mobile Telecommunications System (UMTS), the 3rd Generation Partnership Project (3GPP), Evolution-Data Optimized (EV-DO), or Long Term Evolution (LTE).

Many wireless broadband network systems comprise base stations that serve mobile user devices. Within the wireless base station, the power amplifier (PA) is a key component. As more and more networks are deployed, there is an ever increasing pressure to improve the efficiency and lower the cost of these amplifiers. As power amplifiers become more power efficient, there is a corresponding decrease in the cost of the base station. For example, reduced thermal mitigation within the power amplifier reduces the need for cooling requirements such as fans, which, in turn, facilitates the use of smaller transistors. Furthermore, reduced power amplifier power reduces the cost to operate the base station as well.

One way to achieve efficiency improvements in power amplifiers is by allowing the constituent power transistors to operate closer to saturation. Such efficiency improvements, however, may come at the cost of reduced linearity of the amplifier that causes distortion inside the transmission band, which affects the ability of the amplifier to support high order modulation schemes, and outside of the transmission band, which affects the ability of the amplifier to comply with regulatory emission requirements.

SUMMARY OF THE INVENTION

In accordance with an embodiment of the present invention, a system for multi-band predistortion has a predistortion actuator that applies a first adjustable distortion to a first band input based on the first band input and at least one further band input to provide a first band output. The predistortion actuator further applies a second adjustable distortion to the at least one further band based on the at least one further band input and the first band input to provide a second band output. The predistortion actuator drives an output port configured to be coupled to an amplifier. The system further has an output processor coupled to an evaluation input, where the evaluation input is couplable to an output of the amplifier. The system also includes a coefficient calculation block coupled to an output of the output processor, the first band input, and the at least one further band input. The coefficient calculation block calculates coefficients for the first and second adjustable distortion based on the first band input, the second band input and the output of the output processor.

In accordance with another embodiment of the present invention, a circuit for driving an amplifier includes a predistortion actuator having a first baseband input, a second baseband input, and a first baseband output and a second baseband output. The predistortion actuator applies non-linearities to the first baseband input and the second baseband input based on a set of distortion coefficients that include cross-terms between the first and second baseband inputs. The circuit also has a frequency translator having a first input coupled to the first baseband output and a second input coupled to the second baseband output. An output port, which is configured to drive an input of the amplifier, is coupled to an output of the frequency translator. The circuit also includes an input port configured to be coupled to an output of the amplifier and a receive processor coupled to the input port. The receive processor downconverts a first frequency band from the input port to form a first downconverted frequency band and generates a first error signal based on a difference between the first downconverter frequency band and the first baseband input. The receive processor also downconverts a second frequency band from the input port to form a second downconverted frequency band, and generates a second error signal based on a difference between the first downconverter frequency band and the first baseband input. The circuit also includes a coefficient calculator coupled between the receive processor and the predistortion actuator. The coefficient calculator calculates the distortion coefficients to minimize the first and second error signals.

In accordance with another embodiment, a method of driving a circuit includes providing a plurality of baseband input signals, processing the plurality of baseband input signals with a plurality of non-linear functions to produce a plurality of baseband output signals, where the plurality of non-linear functions are controlled by a set of coefficients having direct terms for each of the plurality of baseband input signals and cross-terms between each of the plurality of baseband input signals. The method also includes upconverting the plurality of baseband output signals to a plurality of output bands, driving an input of the circuit with the plurality of output bands, and receiving the plurality of output bands from an output of the circuit. The method further includes downconverting the plurality of received output bands to baseband to produce a plurality of downcoverted output bands, comparing each of the plurality of downconverted output bands to corresponding ones of the plurality of baseband input signals to produce a plurality of error signals, and training the set of coefficients to minimize the plurality of error signals.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
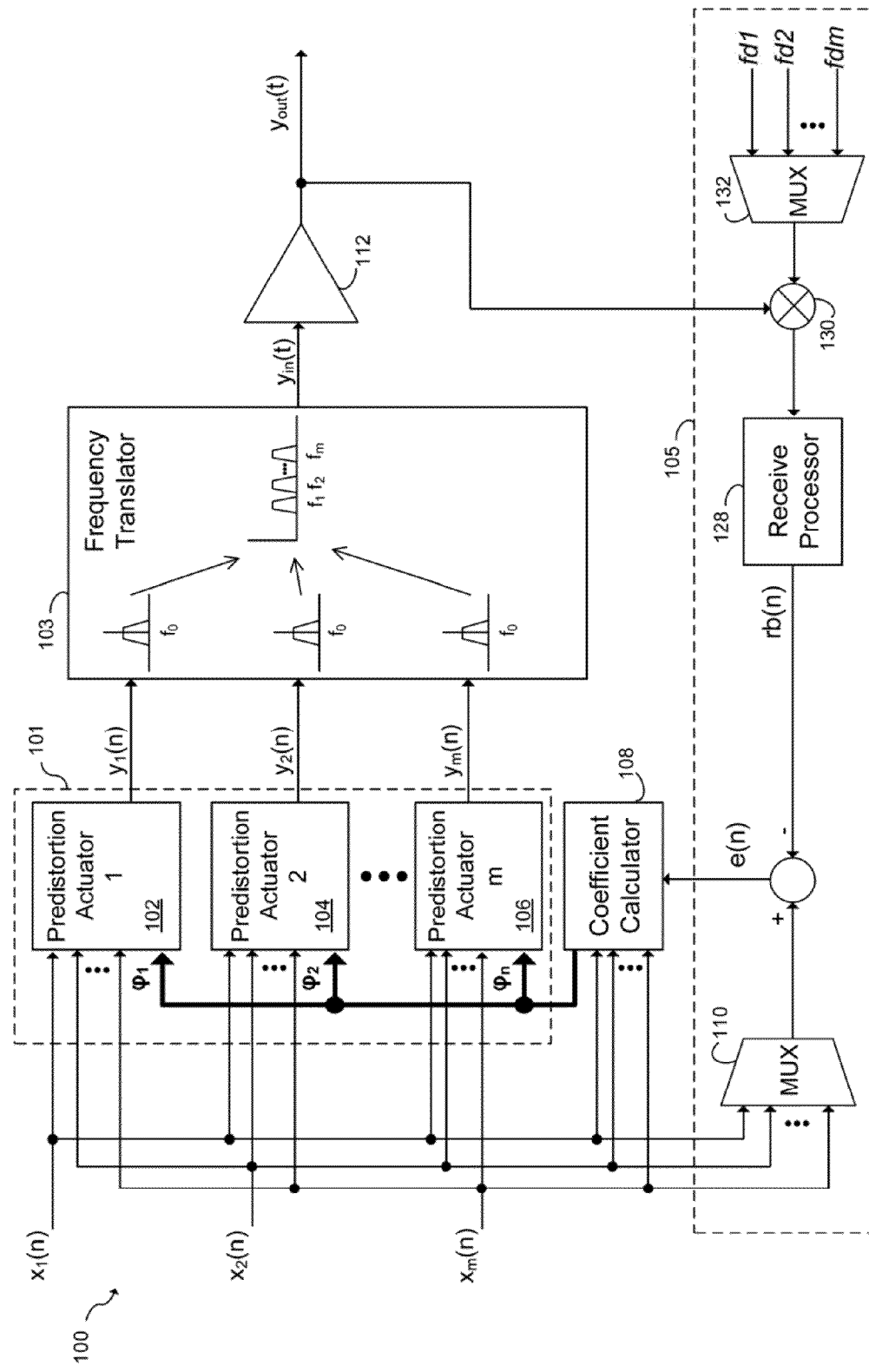
FIG. 1 illustrates a diagram of an embodiment distortion compensated transmission system.

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely multi-band predistortion for an amplifier. The invention may also be used to apply linearity improvement in other circuits and systems.

In an embodiment of the present invention, a single amplifier is used to transmit two or more bands, where a multi-band signal driving the input of the single amplifier is digitally predistorted to compensate for non-linearities in the single amplifier. A feedback receiver monitors the output of the amplifier and an adaptive loop is used to generate an inverse characteristic of the amplifier. This inverse characteristic is then applied to the multi-band input signal prior to amplification. Consequently, after amplification of the signal, the overall characteristic of the system will be more linear than an uncompensated system.

In one embodiment, these bands are widely spaced, for example, greater than 130 MHz apart. In alternative embodiments, these bands may be spaced closer than 130 MHz. In an embodiment, the system uses a feedback receiver to process a portion of the multi-band output signal whose bandwidth is less than the bandwidth of the entire multi-band signal. In one embodiment, each band of the multi-band signal is considered independently by a feedback receiver, for example, a narrowband receiver. Alternatively, more than one feedback receiver can be used, where each receiver processes different portions of the bandwidth. In an embodiment, the feedback receiver is a narrowband feedback receiver.

The non-linearities of an amplifier are functions of the envelope of the complex baseband input signal to the amplifier. Consequently, if this complex baseband signal is made of sub-signals (each corresponding to separate bands), the output distortion of one sub-signal will be dependent on other bands of the complex baseband signal.

The dependency of the distortion of one band on other bands can be illustrated by considering a non-linearity of the form:

$$y(n) = x(n)|x(n)|^2, \quad (1)$$

where $x(n)$ is the complex baseband equivalent of the amplifier's input, $|x(n)|$ is the corresponding envelope signal, and $y(n)$ is the non-linear output. In the case of multi-band signals, $x(n)$ can be expressed as:

$$x(n) = x_A(n)e^{-j2\pi\frac{f_A}{F_s}n} + x_B(n)e^{j2\pi\frac{f_B}{F_s}n}, \quad (2)$$

where $x_A(n)$ is the complex baseband signal associated with band "A", $x_B(n)$ is the complex baseband signal associated with band "B", $f_A$ is the carrier frequency of band "A" (relative to the center of the total signal $x(n)$), $f_B$ is the digital carrier frequency of band "B", and $F_s$ is the sampling frequency associated with $x(n)$. In this example, the bands are separated by $(f_A+f_B)$ Hz. The corresponding non-linear output of the example given in Eqn. 1 can be expressed as:

$$y(n) = \\ e^{j2\pi\frac{f_A}{F_s}n}\{F_1\} + e^{j2\pi\frac{f_B}{F_s}n}\{F_2\} + e^{j2\pi\frac{(2f_A-f_B)}{F_s}n}\{F_3\} + e^{j2\pi\frac{(2f_B-f_A)}{F_s}n}\{F_4\} \quad (3)$$

where, $$F_1 = x_A(n)(|x_A(n)|^2 + 2|x_B(n)|^2), \quad (4)$$

$$F_2 = x_B(n)(|x_B(n)|^2 + 2|x_A(n)|^2), \quad (5)$$

$$F_3 = x^2{}_A(n)x^*{}_B(n), \text{ and} \quad (6)$$

$$F_4 = x^2{}_B(n)x^*{}_A(n). \quad (7)$$

In the expression of equation 3 above, at least three distinct components are present, namely, distortion terms directly affecting Band A ($F_1$ term), distortion terms directly affecting Band B ($F_2$ term), and intermodulation components that appear outside the two bands ($F_3$ and $F_4$ terms). It can be seen, for example, in the expression of the $F_1$ term in equation 4, that the $F_1$ term, which affects band "A," is a function of both $x_A(n)$, the complex baseband signal associated with band "A", and $x_B(n)$, the complex baseband signal associated with band "B."

In embodiments of the present invention, the predistortion of each Band A and Band B are compensated with respect to predistortion. In some embodiments, intermodulation components $F_3$ and $F_4$ terms are not compensated if they appear outside of the two bands. In this case, these components can be attenuated with filtering. In alternative embodiments, however, intermodulation distortion can also be compensated.

In an embodiment of the present invention, input signals for all bands are taken into account when calculating the predistortion for a specific band. In one embodiment, a narrowband receiver observes only one band at a time. In a further embodiment, predistortion coefficients are calculated according to the amplifier's operating region, as defined by the signal characteristics of all band input signals.

Amplifying system 100, according to an embodiment of the present invention, is illustrated in FIG. 1. System 100 has amplifier 112 that outputs $y_{out}(t)$, which is an upconverted version of m baseband signals $x_1(n)$, $x_2(n)$ to $x_m(n)$, where m is at least two. System 100 has predistortion actuator 101 that applies predistortion compensation to baseband signals, $x_1(n)$, $x_2(n)$ to $x_m(n)$, to form predistorted baseband signals $y_1(n)$, $y_2(n)$ to $y_m(n)$. Frequency translator 103 upconverts predistorted baseband signals $y_1(n)$, $y_2(n)$ to $y_m(n)$ to produce amplifier input $y_{in}(t)$, which includes the sum of upconverted band signals $z_1(n)$, $z_2(n)$ to $z_m(n)$. In embodiments, where predistortion actuator 101 is implemented digitally, a digital to analog conversion is performed within frequency translator 103.

In an embodiment, predistortion actuator 101 predistorts baseband signals $x_1(n)$, $x_2(n)$ to $x_m(n)$ such that non-linear characteristics of amplifier 112 are compensated according to distortion coefficients $\phi_1$, $\phi_2$, to $\phi_m$. Feedback block 105 evaluates output $y_{out}(n)$ for each upconverted output band corresponding to baseband signals $x_1(n)$, $x_2(n)$ to $x_m(n)$, and generates an error signal $e(n)$ corresponding difference between the desired and transmitted baseband signals. Error signal $e(n)$ is used by the predistortion actuator to update coefficient vectors $\phi_1$, $\phi_2$, to $\phi_m$.

Predistortion actuator 101 is made of predistortion actuators 102, 104 and 106 corresponding to bands 1 through m. Each predistortion actuator 102, 104 and 106 has as all bands as inputs. In alternative embodiments, however, each predistortion actuator 102, 104 and 106 can have a subset of the total bands, depending on the particular embodiment and its specifications. Furthermore, in alternative embodiments, each predistortion actuator can correspond to a portions of bands, more than one band, or portions of more than one band. Each predistortion actuator 102, 104 and 106 applies coefficient vector $\phi_1$, $\phi_2$, to $\phi_m$, respectively to each of its respective inputs $x_1(n)$, $x_2(n)$ to $x_m(n)$. Coefficient calculator 108 updates coefficient vectors $\phi_1$, $\phi_2$, to $\phi_m$ according to error signal $e(n)$ from feedback block 105, and corresponding baseband signals $x_1(n)$, $x_2(n)$ to $x_m(n)$. In embodiments, of the present invention, predistortion actuator 101 can be implemented digitally via a microprocessor, microcontroller, digital signal processor, and/or custom hardware. Alternatively, predistortion actuator can be implemented in the analog domain. In one embodiment, the predistortion actuator operates at a multiple of the baseband rate, for example five times the baseband rate, in order to represent non-linearities at higher frequencies.

Frequency translator 103 upconverts predistorted baseband signals $y_1(n)$, $y_2(n)$ to $y_m(n)$ to carrier frequencies f1, f2 to fm, respectively, to produce amplifier input $y_{in}(t)$. In embodiments of the present invention, frequency translator 103 can be implemented in the digital domain, the analog domain, or a combination of both the digital and analog domains. For example, portions of frequency translator 103 can be implemented digitally, for example, with a complex digital tuner followed by a dual digital-to-analog (D/A) converter and a quadrature upconverter. In further embodiments, frequency translator 103 can be implemented in the analog domain using techniques known in the art, for example, single or multiple conversion tuners using mixers and oscillators with frequency references generated by using LC and/or crystal oscillators using phase locked loop (PLL) techniques. In yet further embodiments other upconversion methods and techniques known in the art can be used Feedback block 105 has downconversion mixer 130 coupled to receive processor 128. Multiplexer 132 selects downconversion carrier frequencies fd1, fd2 and fdm in order to mix output $y_{out}(t)$ of amplifier 112 down to baseband one band at a time. In alternative embodiments, downconversion mixer 130 can be implemented using methods and techniques known in the art, using, for example, a single or dual conversion tuner depending on the particular application and its specifications. In an alternative embodiment, one or more bands can be converted down to baseband in parallel.

In one embodiment, receive processor 128 performs an analog-to-digital A/D conversion of the output of mixer 130 and a time and phase adjustment of the received signal to produce signal $rb(n)$. In some embodiments, receive processor 128 also performs demodulation, filtering and/or sample rate conversion. Multiplexer 110 selects one of baseband signals $x_1(n)$, $x_2(n)$ to $x_m(n)$ corresponding to the downconverted band. The selected baseband signal is compared with $rb(n)$ to produce error signal $e(n)$. In some embodiments, an additional delay (not shown) is added to the input and/or output of multiplexer 110 in order to further time align the output of multiplexer 110 with signal $rb(n)$. In a further alternative embodiment, feedback block 105 mixes each band down to an intermediate frequency.

Figure 2:
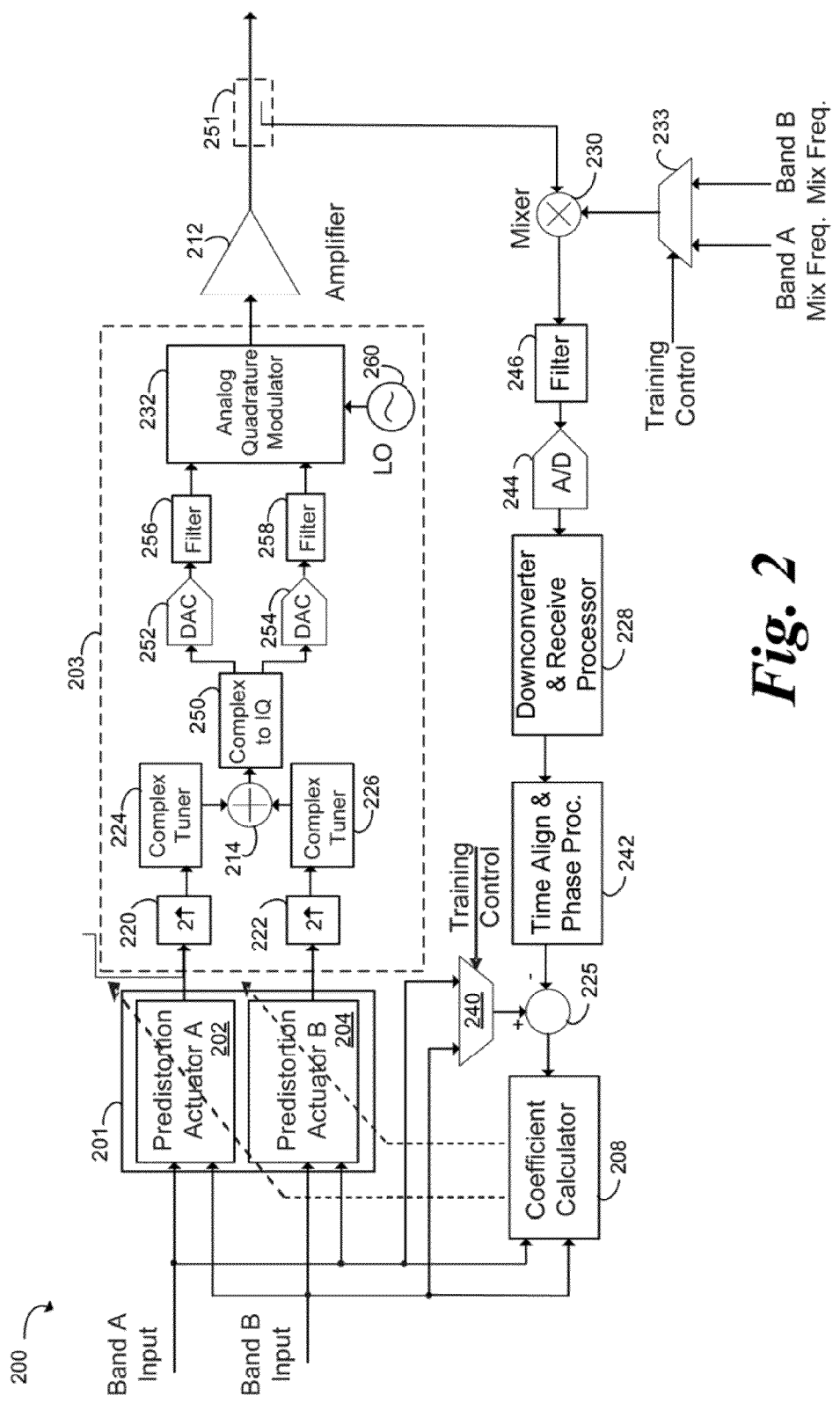
FIG. 2 illustrates a diagram of another embodiment distortion compensated transmission system.

FIG. 2 illustrates transmission system 200 according to another embodiment of the present invention, in which non-linear characteristics of amplifier 212 are compensated. System 200 has predistortion actuator 201 that applies a non-linearity to the Band A input and the Band B input according to embodiments described herein. The output of predistortion actuator 201 is unconverted by upconversion block 203, the output of which is fed into amplifier 212. A portion of the output energy of amplifier 212 is coupled via coupler 251 and downconverted to a suitable intermediate frequency by mixer 230. In an alternative embodiment, mixer 230 converts band output of amplifier to baseband or zero IF.

The output of mixer 230 is filtered by filter 246 and converted to the digital domain by A/D converter 244. Downconverter and receive processor 228 further downconverts the received sampled signal down to a complex baseband signal with the same sample rate as the input signal to predistortion actuator 201 (Band A Input and Band B Input). Time and phase alignment block 242 align the digitized and downconverted output of amplifier 212 to a corresponding selected baseband input. The error signal difference between the downconverted signal and the corresponding selected baseband input is used by coefficient calculation block 208 to update distortion coefficients in predistortion actuator 201.

Predistortion actuator 201 has a predistortion actuator 202 and 204 for Band A and Band B respectively. Each predistortion actuator 202 and 204 applies a non-linear function to Band A and Band B. In an embodiment, predistortion actuator 201 operates at a multiple of the baseband rate, for example, 5 times the baseband rate, to represent higher frequency components of the applied non-linearities. Alternatively, other sampling rate increase factors can be used.

In upconversion block 203, each band has an upsampling block 220 and 222 followed by a complex tuner 224 and 226. Complex tuners 224 and 226 provide frequency translation from baseband to a desired frequency offset in order to obtain the required band separation. In an embodiment, upsampling blocks 220 and 222 increase the sampling rate of the baseband signal to a sampling rate sufficient to support the required band separation. In the embodiment of FIG. 2, the baseband sampling rate is upsampled by a factor of two. In alternative embodiments, the upsampling factor may be greater than two depending on the sampling rate of the actuator and the required band separation. In embodiments, upsampling blocks 220 and 222 and complex tuner 224 and 226 are implemented using digital techniques known in the art. These digital techniques may include, for example, polyphase filtering for upsampling and a coordinate rotation digital computer (CORDIC) for complex tuning.

In embodiments, summer 214 sums the complex output of complex tuners 224 and 226, and complex to IQ conversion block 250 converts the complex signal in-phase (I) and quadrature (Q) signals. Dual digital to analog converters 252 and 254 convert the I and Q signals into the analog domain, the outputs of which are filtered by filters 256 and 258. The I and Q signals are further upconverted by analog quadrature modulator 232 driven by local oscillator 260. In some embodiments, Upconversion block 203 can include various analog and/or digital components and use various upconversion techniques known in the art. Such upconversion techniques can include upsampling, quadrature modulation, complex tuning, filtering etc. In one example embodiment, predistortion actuator 201 operates at a rate of 150 MHz, and complex tuners 224 and 226 and combiner 214 operates at a rate of 300 MHz to achieve a 130 MHz band separation. The output of combiner 214 is further upsampled by 2 (not shown) to output samples at 600 MHz, and DACs 252 and 254 operate at 600 MHz. Analog quadrature modulator with an LO of 1.952 GHz.

During operation of transmission system 200, coefficients of predistortion actuator 201 are trained, in part, through the operation of multiplexers 240 and 233. When predistortion actuator 202, which operates on band A, is being trained, signal Training Control selects the baseband signal of Band A via multiplexer 240. Band A is then compared to the feedback signal by summer 225 to produce the error input to coefficient calculator 208. Accordingly, the LO input to mixer 230 corresponding to band A, (Band A Mix Freq.) is also selected by signal Training Control. Similarly, when predistortion actuator 204 is being trained to compensate for amplifier non-linearities in band B, Band B Input and Band B Mix Freq are selected by multiplexers 240 and 233, respectively.

As shown in FIGS. 1 and 2, predistortion actuators use the signals from all bands or from a plurality of bands when calculating the predistortion signal for a particular band. In the embodiment of FIG. 2, the non-linear function used by predistortion actuator 202 for Band A is given by:

$$y_A(n) = \sum_{q=0}^{Q_1} \sum_{k=0}^{K_1} \phi_{1,q,k} x_A(n-k)|x_A(n-k)|^q + \qquad (8)$$

$$\sum_{q=0}^{Q_2} \sum_{k=0}^{K_2} \phi_{2,q,k} x_A(n-k)|x_B(n-k)|^q +$$

$$\sum_{q=0}^{Q_3} \sum_{k=0}^{K_3} \phi_{3,q,k} x_A(n-k)|x_A(n-k)|^q |x_B(n-k)|^q$$

where $y_A(n)$ is the first band output, $x_A(n)$ is the first band input, $x_B(n)$ is the at least one further band input, $\phi_{1,q,k}$, $\phi_{2,q,k}$ and $\phi_{3,q,k}$ are distortion coefficients, $K_1$, $K_2$ and $K_3$ are a maximum number of sample delays, and $Q_1$, $Q_2$ and $Q_3$ are maximum orders of non-linearity. In some embodiments, $K_1=K_2=K_3=K$ and $Q_1=Q_2=Q_3=Q$. Note that the output of Band A predisorter 201 is a function of the magnitude of the Band A input signal, the magnitude of the Band B input signal, and the product of the magnitudes of the Band A input signal and the Band B input signal. Depending on the non-linear characteristics of amplifier 212, other terms may be required such as $$\sum_{q=0}^{Q_4} \sum_{k=0}^{K_4} \phi_{4,q,k} x_A(n-k)|x_A(n-k)|^{2q}|x_B(n-k)|^q, \qquad (9)$$

$$\text{and} \sum_{q=0}^{Q_5} \sum_{k=0}^{K_5} \phi_{5,q,k} x_A(n-k)|x_A(n-k)|^q |x_B(n-k)|^{2q},$$

where $\phi_{4,q,k}$ and $\phi_{5,q,k}$ are further distortion coefficients, $K_4$ and $K_5$ are maximum numbers of sample delays and $Q_4$ and $Q_5$ are maximum orders of non-linearity. In alternative embodiments, $K_4=K_5=K$ and $Q_4=Q_5=Q$. Potential variations in terms include different powers, different delays between the constituent terms, or a combination thereof.

Figure 3:
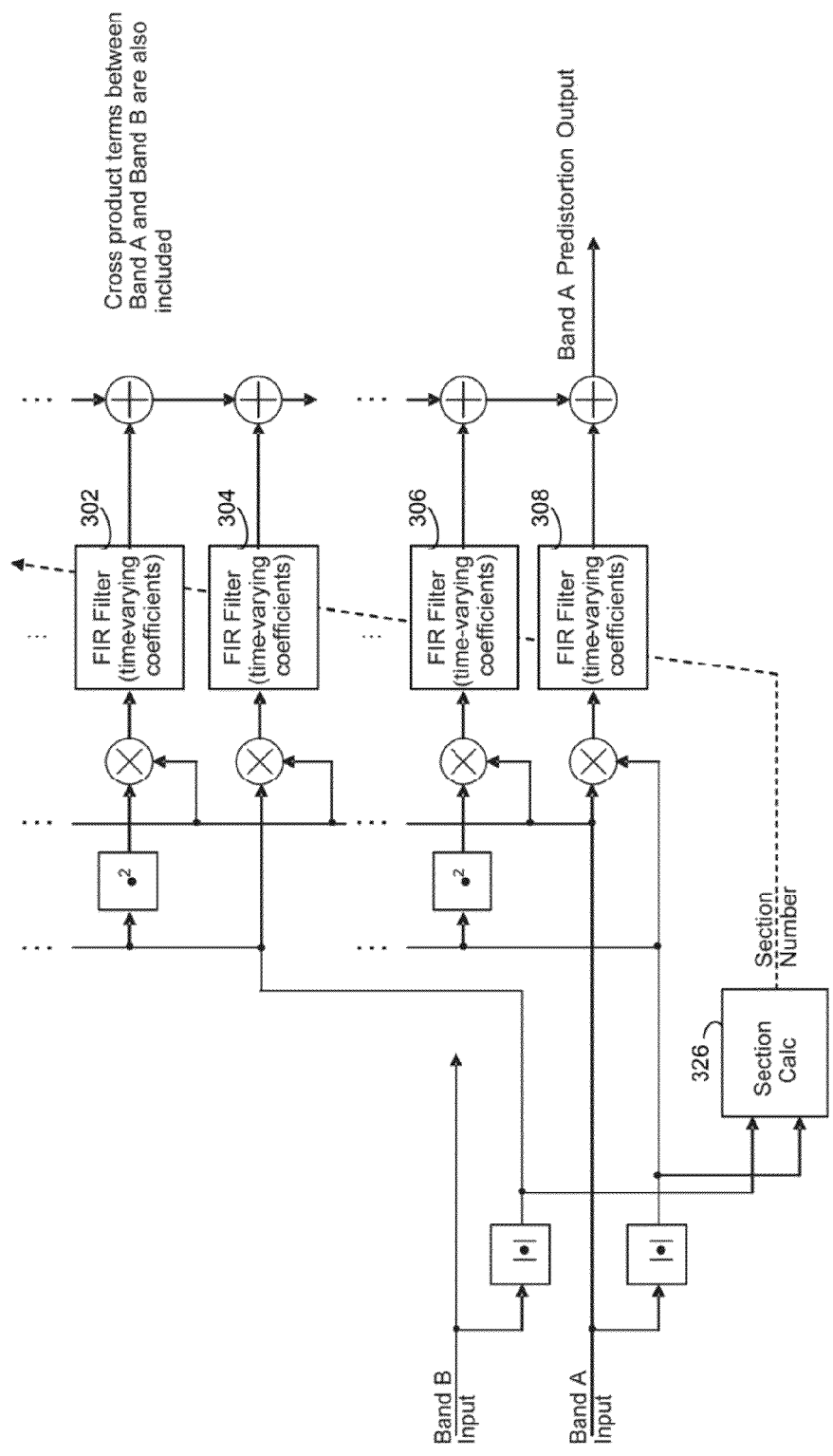
FIG. 3 illustrates an embodiment predistortion actuator.

FIG. 3 illustrates a functional block diagram of an embodiment predistortion actuator showing the application of each term of the non-linear function of equation 8 being applied to finite impulse response (FIR) filters 302, 304, 306 and 308. Coefficients used by FIR filters 302, 304, 306 and 308 are controlled by Section Calculator 326 and calculated by coefficient calculation block 208 (See FIG. 2).

In some embodiments, the overall non-linearity of the amplifier will vary according to the characteristics of the different band inputs. In an embodiment, the non-linearity of the amplifier is subdivided or sectioned into a number of different regions. Here, a unique set of coefficients is maintained for each predistortion actuator for each region. The different sections are defined in a multi-dimensional manner based on the characteristics of the input signals for all constituent bands. By dividing the overall non-linearity into different regions, it is possible to approximate higher-order characteristics using lower order terms.

Figure 4:
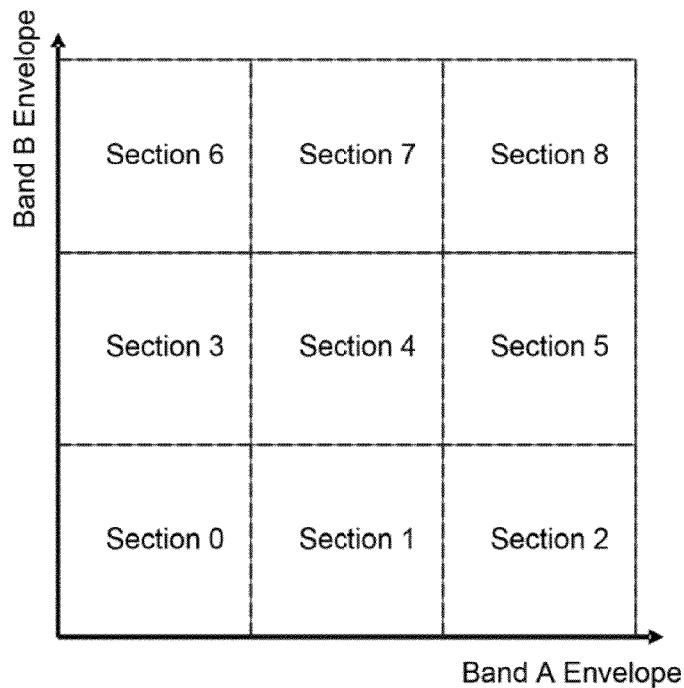
FIG. 4 illustrates an embodiment coefficient sectioning diagram.

An embodiment sectioning diagram is illustrated in FIG. 4. Here, Section 0 though Section 8 are designated based on envelopes for each band. For example, when both Band A and Band B are operating with small signal envelopes, predistortion coefficients correspond with coefficients designated for Section 0. On the other hand, when both Band A and Band B are operating with large signal envelopes, predistortion coefficients correspond with coefficients designated for Section 8. While nine sections are shown, any number of sections can alternatively be used. Coefficient sectioning for intermediate values are partitioned as shown in FIG. 4 for the remaining sections. The embodiment sectioning diagram of FIG. 4 is directed toward an embodiment system having two bands, and, therefore has two dimensions. In alternative embodiments having more than two bands, the section diagram is multi-dimensional. In further embodiments, sectioning can be based on other signal characteristics besides signal envelopes, for example, operating modes and environmental characteristics can also be used to create coefficient sets.

Figure 5:
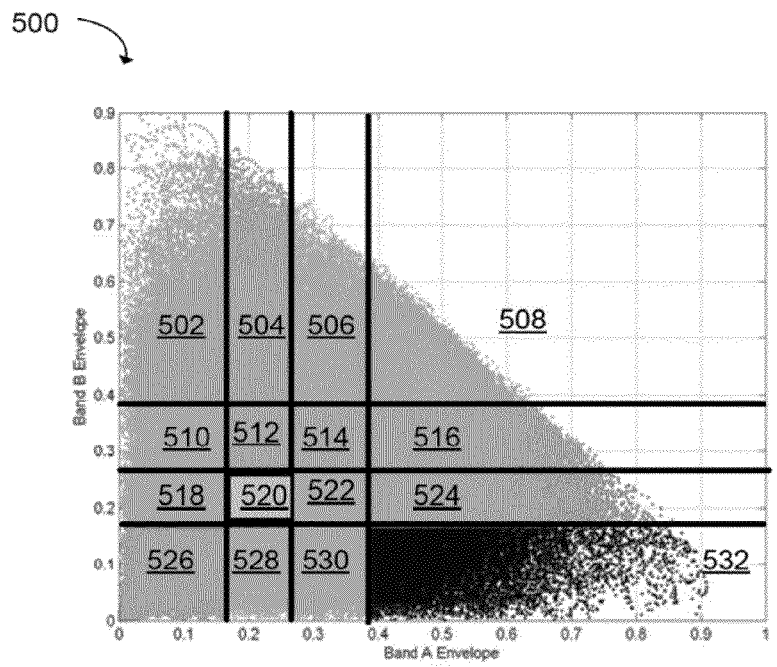
FIG. 5 illustrates another embodiment coefficient sectioning diagram.

In an embodiment, sections are allocated based on the distribution of band envelopes, as shown in the embodiment sectioning diagram of FIG. 5, which illustrates sectioning in a TD-SCDMA system. Here, band predistortion coefficient sets are allocated into sections 502, 504, 506, 508, 510, 512, 514, 516, 518, 520, 522, 524, 526, 528, 530 and 532. Distribution 500 of band envelope samples are shown overlaid under the section grid. Unlike the embodiment of FIG. 5, the sectioning diagram of FIG. 5 is has regions of different sizes. In one embodiment, section boundaries are chosen to statistically contain the same number of baseband samples. Alternatively, sections boundaries can be determined such that they statistically contain different numbers of samples or they can be determined such that a system parameter is minimized or maximized. In a further embodiment, sectioning is determined according to a temporal characteristic, such as a certain time range relative to when the power amplifier (PA) was turned on, for example, in a time division duplex (TDD) system.

Advantages of sectioning the predistortion coefficients include improved correction performance and reduced hardware cost. Additionally, the system may be more stable in some embodiments because of the use of lower order terms.

In an embodiment, a training process is used to determine the coefficients of embodiment predistortion actuators. In a first step of an embodiment training process, coefficients $\phi_{j,q,k}$ of the predistortion actuator are initialized to "passthrough" values that impart no distortion:

$$\varphi_{j,q,k} = \begin{cases} 1, & \text{if } j = 1, q = k = 0 \\ 0, & \text{otherwise.} \end{cases} \quad (10)$$

where, j, k, and q are the subscripts used in equations 8 and 9. In an alternative embodiment, predistortion coefficients can be initialized to other values, for example, a last used set, or a default set.

In a second step, the feedback receiver LO frequency is selected to the appropriate band. In one embodiment, only one band is considered at a time. In alternative embodiments, for example, systems with parallel receive signals paths, more than one band can be considered at a time. In a third step, signals from the feedback receiver are sampled and processed to obtain baseband signal rcv(n), which is then compared to the originally transmitted baseband signal. In some embodiments, sampling and processing may include filtering, data conversion, downconversion, DC offset correction and demodulation, for example.

In a fourth step, baseband signal rcv(n) is time aligned with baseband inputs $x_{bnd}(n)$, which is the reference signal for the specific band. Time alignment is performed in order to compare what was transmitted against what was received in order to determine the non-linear characteristic of the amplifier being compensated. In a fifth step, phase adjustment is applied to the time-aligned samples to obtain adj(n). Here, phase adjustment removes constant phase offset introduced by system and removes non-ideal phase effects (e.g. "phase wander") introduced by system components not including the amplifier. Removing phase offsets helps received sample values be subtracted from reference signal to form an error signal in a synchronized fashion.

In a sixth step, an error signal is calculated in accordance with:

$$b = [x_{bnd}(0) - adj(0) \ldots x_{bnd}(N-1) - adj(N-1)] = [b(0) \ldots b(N-1)]^T, \quad (11)$$

where N is the total number of baseband error samples calculated per capture and T is the transpose operator.

In a seventh step, matrix A is formed that has inputs that are associated with each of the actuator coefficients and correspond with the rows of b. Each column is formed based on the terms that make up the actuator non-linearity as defined in Equations 8 and 9, such that $$A\gamma = b, \quad (12)$$

where $$A = \begin{bmatrix} x_{bnd}(0) & x_{bnd}(-1) & \ldots & x_{bnd}(0)|x_{bnd}(0)| & \ldots \\ x_{bnd}(1) & x_{bnd}(0) & \ldots & x_{bnd}(1)|x_{bnd}(1)| & \ldots \\ \vdots & \vdots & & \vdots & \\ x_{bnd}(N-1) & x_{bnd}(N-2) & \ldots & x_{bnd}(N-1)|x_{bnd}(N-1)| & \ldots \end{bmatrix} \quad (13)$$

$$\gamma = [\gamma_{1,0,0} \gamma_{1,0,1} \ldots \gamma_{J,Q,K}]^T, \quad (14)$$

where, $\gamma$ is an error coefficient, N is the total number of baseband error samples calculated per capture, J is the total number of term types (for example, J=3 in equation 8), K is a maximum number of sample delays and Q is a maximum order of non-linearity.

In an eighth step, matrices A' and b' are formed by selecting only those rows of A and b that are in the desired coefficient section if an embodiment using sectioning is being used. In one embodiment, sections are defined by a specified range of magnitudes for each of the band inputs, for example:

Section 1 → $|x_{bndA}(n)| \geq LB_{A1}$ AND $|x_{bndA}(n)| < UB_{A1}$

AND $|x_{bndB}(n)| \geq LB_{B1}$ AND $|x_{bndB}(n)| < UB_{B1}$, (15)

where $LB_{A1}$, $UB_{A1}$, $LB_{B1}$ and $UB_{B1}$ are thresholds that define the regions of Section 1. Other regions can be similarly defined. For example, Section P → $|x_{bndA}(n)| \geq LB_{AP}$ AND $|x_{bndA}(n)| < UB_{AP}$ AND $|x_{bndB}(n)| \geq LB_{BP}$ AND $|x_{bndB}(n)| < UB_{BP}$, (16)

where $LB_{AP}$, $UB_{AP}$, $LB_{BP}$ and $UB_{BP}$ are thresholds that define the regions of Section P.

A numerical solution for the error coefficient values $\gamma$ is then calculated by solving the set of linear equations:

$$A'\gamma = b' \quad (17)$$

In an embodiment, the set of linear equations can be solved by using Cholesky decomposition or other similar techniques such as QR decomposition or other techniques.

In a ninth step, main actuator coefficient values are updated as a weighted sum of the previous coefficient values and the error coefficient values $$\phi_{n+1} = \phi_n + \mu\gamma, \quad (18)$$

where $\phi_{n+1}$ is a next set of coefficients, $\phi_n$ is a present set of coefficients and $\mu$ is a weighting factor between 0 and 1 that can be used to average the updated coefficients.

In an embodiment, the training process performs a number of iterations (e.g. repeating steps 2-9) before converging to a final solution. In an embodiment, the training process is continuously iterated in order to track any time-varying characteristics of the amplifier. In some embodiments, the training system can be switched between all bands for each iteration, or, in alternative embodiments, the hardware can be duplicated in order to train all bands simultaneously.

Figure 6:
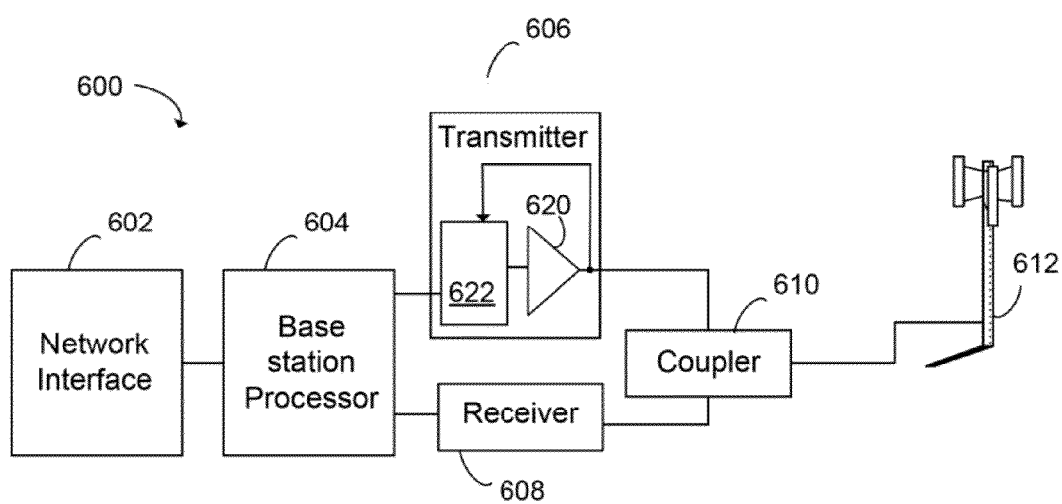
FIG. 6 illustrates a block diagram of an embodiment base station using an embodiment distortion compensated transmitter.

In an embodiment, a transmission system according to the present embodiment is implemented in wireless base station 600, as shown in FIG. 6. Base station 600 has a base station processor 604 coupled to transmitter 606 and receiver 608, and network interface 602. Transmitter 606 and receiver 608 are coupled to antenna 612 via coupler 610. Embodiment transmitter 606 has amplifier 620 compensated by embodiment predistortion circuit 622. Alternatively, base station processor 604 can execute embodiment predistortion algorithms. In embodiments of the present invention, base station 600 is configured transmit a plurality of bands, and may operate, for example, in a LTE network using an OFDMA downlink channel. In alternative embodiments, other systems, network types and transmission schemes can be used, for example, Wimax, and/or 1XEV-DO.

In an embodiment, non-linearities of other circuits besides amplifiers, for example, mixers, data converters, etc. can be compensated using embodiment techniques.

In accordance with an embodiment, a system for multi-band predistortion includes a predistortion actuator. The predistortion actuator applies a first adjustable distortion to a first band input based on the first band input and at least one further band input to provide a first band output. The predistortion actuator applies an at least one further adjustable distortion to the at least one further band based on the at least one further band input and the first band input to provide an at least one further band output. Furthermore, the predistortion actuator is configured to drive an output port configured to be coupled to an amplifier. The system also includes an output processor coupled to an evaluation input, where the evaluation input couplable to an output of the amplifier. Also included is a coefficient calculation block coupled to an output of the output processor, the first band input, and the at least one further band input. In an embodiment, the coefficient calculation block calculates coefficients for the first adjustable distortion and the at least one further adjustable distortion based on the first band input, the at least one further band input and the output of the output processor.

In an embodiment, the system also includes a frequency translator having an output coupled to the output port and at least one input coupled to at least one of the first band output and the at least one further band output. The frequency translator shifts relative frequencies of the first band output and the at least further band output. In some embodiments, the frequency translator shifts the first band output at least 100 MHz from the at least one further band output. In an embodiment, the frequency translator comprises a complex tuner.

In an embodiment, the system also includes a training controller configured to initialize predistortion actuator coefficients. The predistortion actuator coefficients apply the first adjustable distortion to the first band input and the further adjustable distortion to the at least one further band input. The training controller is also configured to cause the output processor to evaluate a signal of the evaluation input, and cause the output processor to calculate a first band error signal representing a difference between the first band input and a first band signal from the evaluation input and calculate a further band error signal representing a difference between the at least one further band input and an at least one further band signal from the evaluation input. In an embodiment, the training controller is further configured to adjust predistortion actuator coefficients to minimize the error signal. In an embodiment, wherein the first band error signal and the at least one further band error signal are evaluated one at a time.

In an embodiment, the coefficients for the first adjustable distortion and the coefficients for the at least one further adjustable distortion each include a plurality of sets of coefficients. Each of the plurality of sets of coefficients corresponds to input ranges of the first band input and the at least one further band input.

In an embodiment, the first band output of the predistortion actuator is expressed by:

$$y_A(n) \sum_{q=0}^{Q_1} \sum_{k=0}^{K_1} \phi_{1,q,k} x_A(n-k)|x_A(n-k)|^q +$$

-continued $$\sum_{q=0}^{Q_2} \sum_{k=0}^{K_2} \phi_{2,q,k} x_A(n-k)|x_B(n-k)|^q +$$

$$\sum_{q=0}^{Q_3} \sum_{k=0}^{K_3} \phi_{3,q,k} x_A(n-k)|x_A(n-k)|^q |x_B(n-k)|^q,$$

where $y_A(n)$ comprises the first band output, $x_A(n)$ is the first band input, $x_B(n)$ is the at least one further band input, $\phi_{1,q,k}$, $\phi_{2,q,k}$ and $\phi_{3,q,k}$ are distortion coefficients, $K_1$, $K_2$ and $K_3$ are maximum numbers of sample delays and $Q_1$, $Q_2$ and $Q_3$ are maximum orders of non-linearity.

In an embodiment, the first band output $y_A(n)$ further includes:

$$\sum_{q=0}^{Q_4} \sum_{k=0}^{K_4} \phi_{4,q,k} x_A(n-k)|x_A(n-k)|^{2q}|x_B(n-k)|^q,$$

$$\text{and} \sum_{q=0}^{Q_5} \sum_{k=0}^{K_5} \phi_{5,q,k} x_A(n-k)|x_A(n-k)|^q|x_B(n-k)|^{2q},$$

where $\phi_{4,q,k}$ and $\phi_{5,q,k}$ are further distortion coefficients, $K_4$ and $K_5$ are maximum numbers of sample delays and $Q_4$ and $Q_5$ are maximum orders of non-linearity. In some embodiments, the predistortion actuator includes a plurality of FIR filters.

In accordance with another embodiment, a circuit for driving an amplifier includes a predistortion actuator including a first baseband input, a second baseband input, a first baseband output and a second baseband output. The predistortion actuator applies non-linearities to the first baseband input and the second baseband input based on a set of distortion coefficients. The distortion coefficients may include cross-terms between the first and second baseband inputs. The circuit also includes a frequency translator having a first input coupled to the first baseband output and a second input coupled to the second baseband output. In addition, the circuit includes an output port, an input port, and a receive processor. The output port is coupled to an output of the frequency translator, and is configured to drive an input of the amplifier. The input port configured to be coupled to an output of the amplifier, and the receive processor is coupled to the input port. In an embodiment, the receive processor is configured to downconvert a first frequency band from the input port to form a first downconverted frequency band, and generate a first error signal based on a difference between the first downconverter frequency band and the first baseband input. The receive processor is further configured to downconvert a second frequency band from the input port to form a second downconverted frequency band, and generate a second error signal based on a difference between the second downconverter frequency band and the second baseband input. In an embodiment, the circuit further includes a coefficient calculator coupled between the receive processor and the predistortion actuator. The coefficient calculator calculates the distortion coefficients to minimize the first and second error signals.

In some embodiments, the circuit may also include an upconverter coupled between the output of the frequency translator and the output port. Furthermore, the receive processor may include a mixer and an A/D converter. In some embodiments, the first error signal and the second error signals are evaluated one at a time. In addition, the coefficient calculator may use a least mean square algorithm to calculate distortion coefficients. In some embodiments, the circuit schedules a plurality of distortion coefficient sets based on envelopes of the first baseband input and the second baseband input. In some cases, the plurality of distortion coefficient sets may be optimized to minimize overall output distortion. The distortion coefficients may also be configured to provide predistortion to the amplifier.

In accordance with a further embodiment, a method of driving a circuit includes providing a plurality of baseband input signals, processing the plurality of baseband input signals with a plurality of non-linear functions to produce a plurality of baseband output signals, upconverting the plurality of baseband output signals to a plurality of output bands, and driving an input of the circuit with the plurality of output bands. In some embodiments, the circuit may include an amplifier. The method also includes receiving the plurality of output bands from an output of the circuit, downconverting the plurality of received output bands to baseband to produce a plurality of downcoverted output bands and comparing each of the plurality of downconverted output bands to corresponding ones of the plurality of baseband input signals to produce a plurality of error signals. The method may also include training the set of coefficients to minimize the plurality of error signals. The plurality of non-linear functions may be controlled by a set of coefficients having direct terms for each of the plurality of baseband input signals and cross-terms between each of the plurality of baseband input signals.

In an embodiment, downconverting the plurality of received output bands includes downconverting the plurality of received output bands one at a time. In some embodiments, training the set of coefficients includes training a set of coefficients for a first of a plurality of output bands, which includes initializing the set of coefficients for the first of the plurality of output bands, sampling the first of the plurality of downconverted output bands to produce a first sampled band, time aligning the first sampled band with a first of the plurality of baseband input signals to produce a first time aligned signal, calculating an error signal between the first time aligned signal and first of the plurality of baseband input signals, and updating the set of coefficients to reduce a magnitude of the error signal. Training also may include repeating the training of the set of coefficients for a first of a plurality of output bands until the set of coefficients converges to a final solution within an error bound. In an embodiment, sets of coefficients for are trained for remaining ones of the plurality of output bands.

In an embodiment, initializing the set of coefficients includes initialing coefficients $\phi_{j,q,k}$ to:

$$\varphi_{j,q,k} = \begin{cases} 1, & \text{if } j=1, q=k=0 \\ 0, & \text{otherwise}, \end{cases}$$

where j is a coefficient type, q is a non-linearity order, and k is a linear delay. Calculating the error signal includes calculating a vector b:

$$b=[x_{bnd}(0)-adj(0) \ldots x_{bnd}(N-1)-adj(N-1)]=[b(0) \ldots b(N-1)]^T,$$

where $x_{bnd}(n)$ is the first of the plurality of baseband input signals, adj(n) is the first time aligned signal and N is a total number of baseband error samples calculated per capture and T is a transpose operator. In an embodiment, updating the set of coefficients includes forming a matrix A such that $A\gamma=b$, where:

$$A = \begin{bmatrix} x_{bnd}(0) & x_{bnd}(-1) & \ldots & x_{bnd}(0)|x_{bnd}(0)| & \ldots \\ x_{bnd}(1) & x_{bnd}(0) & \ldots & x_{bnd}(1)|x_{bnd}(1)| & \ldots \\ \vdots & \vdots & & \vdots & \\ x_{bnd}(N-1) & x_{bnd}(N-2) & \ldots & x_{bnd}(N-1)|x_{bnd}(N-1)| & \ldots \end{bmatrix},$$

$$\gamma=[\gamma_{1,0,0}\gamma_{1,0,1} \ldots \gamma_{J,Q,K}]^T$$

where $\gamma$ are error coefficient values. A numerical solution for error coefficient values $\gamma$, may be calculated by solving $A\gamma=b$, and updating the set of coefficients as a weighted sum of previous coefficient values and error coefficient values such that $\phi_{n+1}=\phi_n+\mu\gamma$, where $\mu$ is a weighting factor between 0 and 1.

In an embodiment, training the set of coefficients to minimize the plurality of error signals includes training a plurality of sets of coefficients, where each of the plurality of sets of coefficients corresponding to input ranges of each of the plurality of baseband input. Training the plurality of sets of coefficients includes defining p coefficient sections such that Section $P \rightarrow |x_{bndA}(n)| \geq LB_{AP}$ AND $|x_{bndA}(n)| < UB_{AP}$ AND $|x_{bndB}(n)| \geq LB_{BP}$ AND $|x_{bndB}(n)| < UB_{BP}$, where $LB_{AP}$, $UB_{AP}$, $LB_{BP}$ and $UB_{BP}$ are thresholds that define the regions of Section P. Training also includes forming A' and b' by selecting rows of A and b corresponding to coefficients pertaining to the one of a plurality of coefficient sections, calculating a numerical solution for error coefficient values $\gamma$, by solving $A'\gamma=b'$, and updating the set of coefficients as a weighted sum of the previous coefficient values and error coefficient values such that $\phi_{n+1}=\phi_n+\mu\gamma$.

Advantages of some embodiments of the present invention include the ability to transmit two or more widely spaced bands with a single amplifier, rather than two or more amplifiers. Another advantage of embodiments includes having a cost effective receiver in the feedback path when the bandwidth of the feedback path is less than the total bandwidth of all transmitted bands combined. Such an embodiment feedback receiver is more cost effective because component costs for narrow band amplifiers are lower than for wider band receivers. In some embodiments using a lower bandwidth feedback path, additional cost savings and performance improvements can be achieved because A/D converters of lower sampling rates cost less, consume less power, and perform better than A/D converters with higher sampling rates.

Although present embodiments and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for multi-band predistortion comprising:
   a predistortion actuator, wherein
      the predistortion actuator applies a first adjustable distortion to a first band input based on the first band input and at least one further band input to provide a first band output,
      the predistortion actuator applies an at least one further adjustable distortion to the at least one further band based on the at least one further band input and the first band input to provide an at least one further band output, and
      the predistortion actuator is configured to drive an output port configured to be coupled to an amplifier;
   an output processor coupled to an evaluation input, the evaluation input couplable to an output of the amplifier; and
   a coefficient calculation block coupled to an output of the output processor, the first band input, and the at least one further band input, the coefficient calculation block calculating coefficients for the first adjustable distortion and the at least one further adjustable distortion based on the first band input, the at least one further band input and the output of the output processor.

2. The system of claim 1, further comprising a frequency translator having an output coupled to the output port and at least one input coupled to at least one of the first band output and the at least one further band output, the frequency translator shifting relative frequencies of the first band output and the at least further band output.

3. The system of claim 2, wherein the frequency translator shifts the first band output at least 100 MHz from the at least one further band output.

4. The system of claim 2 further comprising a training controller configured to:
   initialize predistortion actuator coefficients, wherein the predistortion actuator coefficients apply the first adjustable distortion to the first band input and the further adjustable distortion to the at least one further band input;
   cause the output processor to evaluate a signal of the evaluation input;
   cause the output processor to calculate a first band error signal representing a difference between the first band input and a first band signal from the evaluation input and calculate a further band error signal representing a difference between the at least one further band input and an at least one further band signal from the evaluation input; and
   adjust predistortion actuator coefficients to minimize the error signal.

5. The system of claim 4, wherein the first band error signal and the at least one further band error signal are evaluated one at a time.

6. The system of claim 2, wherein the frequency translator comprises a complex tuner.

7. The system of claim 1, wherein the coefficients for the first adjustable distortion and the coefficients for the at least one further adjustable distortion each comprise a plurality of sets of coefficients, each of the plurality of sets of coefficients corresponding to input ranges of the first band input and the at least one further band input.

8. The system of claim 1, further comprising the amplifier.

9. The system of claim 1, wherein the first band output of the predistortion actuator is expressed by:

$$y_A(n) \sum_{q=0}^{Q_1} \sum_{k=0}^{K_1} \phi_{1,q,k} x_A(n-k) |x_A(n-k)|^q +$$

$$\sum_{q=0}^{Q_2} \sum_{k=0}^{K_2} \phi_{2,q,k} x_A(n-k) |x_B(n-k)|^q +$$

$$\sum_{q=0}^{Q_3} \sum_{k=0}^{K_3} \phi_{3,q,k} x_A(n-k) |x_A(n-k)|^q |x_B(n-k)|^q,$$

where $y_A(n)$ comprises the first band output, $x_A(n)$ is the first band input, $x_B(n)$ is the at least one further band input, $\phi_{1,q,k}$, $\phi_{2,q,k}$ and $\phi_{3,q,k}$ are distortion coefficients, $K_1$, $K_2$ and $K_3$ are maximum numbers of sample delays and $Q_1$, $Q_2$ and $Q_3$ are maximum orders of non-linearity.

10. The system of claim 1, wherein the first band output $y_A(n)$ further comprises:

$$\sum_{q=0}^{Q_4} \sum_{k=0}^{K_4} \phi_{4,q,k} x_A(n-k) |x_A(n-k)|^{2q} |x_B(n-k)|^q,$$

$$\text{and} \sum_{q=0}^{Q_5} \sum_{k=0}^{K_5} \phi_{5,q,k} x_A(n-k) |x_A(n-k)|^q |x_B(n-k)|^{2q},$$

wherein $\phi_{4,q,k}$ and $\phi_{5,q,k}$ are further distortion coefficients, $K_4$ and $K_5$ are maximum numbers of sample delays and $Q_4$ and $Q_5$ are maximum orders of non-linearity.

11. The system of claim 1, wherein the predistortion actuator comprises a plurality of FIR filters.

12. A circuit for driving an amplifier, the circuit comprising:
   a predistortion actuator comprising a first baseband input, a second baseband input, a first baseband output and a second baseband output, the predistortion actuator applying non-linearities to the first baseband input and the second baseband input based on a set of distortion coefficients, wherein the distortion coefficients comprise cross-terms between the first and second baseband inputs;
   a frequency translator having a first input coupled to the first baseband output and a second input coupled to the second baseband output;
   an output port coupled to an output of the frequency translator, the output port configured to drive an input of the amplifier;
   an input port configured to be coupled to an output of the amplifier;
   a receive processor coupled to the input port, the receive processor configured to
      downconvert a first frequency band from the input port to form a first downconverted frequency band, and generate a first error signal based on a difference between the first downconverter frequency band and the first baseband input, and
      downconvert a second frequency band from the input port to form a second downconverted frequency band, and generate a second error signal based on a difference between the second downconverter frequency band and the second baseband input; and
a coefficient calculator coupled between the receive processor and the predistortion actuator, the coefficient calculator calculating the distortion coefficients to minimize the first and second error signals.

13. The circuit of claim 12, further comprising an upconverter coupled between the output of the frequency translator and the output port.

14. The circuit of claim 12, wherein the receive processor comprises a mixer and an A/D converter.

15. The circuit of claim 12, wherein the first error signal and the second error signals are evaluated one at a time.

16. The circuit of claim 12, wherein the coefficient calculator uses a least mean square algorithm to calculate distortion coefficients.

17. The circuit of claim 12, wherein the circuit schedules a plurality of distortion coefficient sets based on envelopes of the first baseband input and the second baseband input.

18. The circuit of claim 17, wherein the plurality of distortion coefficient sets are optimized to minimize overall output distortion.

19. The circuit of claim 12, wherein the distortion coefficients are configured to provide predistortion to the amplifier.

20. A method of driving a circuit, the method comprising:
providing a plurality of baseband input signals;
processing the plurality of baseband input signals with a plurality of non-linear functions to produce a plurality of baseband output signals, wherein the plurality of non-linear functions are controlled by a set of coefficients having direct terms for each of the plurality of baseband input signals and cross-terms between each of the plurality of baseband input signals;
upconverting the plurality of baseband output signals to a plurality of output bands;
driving an input of the circuit with the plurality of output bands;
receiving the plurality of output bands from an output of the circuit, and downconverting the plurality of received output bands to baseband to produce a plurality of downcoverted output bands;
comparing each of the plurality of downconverted output bands to corresponding ones of the plurality of baseband input signals to produce a plurality of error signals; and
training the set of coefficients to minimize the plurality of error signals.

21. The method of claim 20, wherein the downconverting the plurality of received output bands comprises downconverting the plurality of received output bands one at a time.

22. The method of claim 20, wherein training the set of coefficients comprises:
training a set of coefficients for a first of a plurality of output bands, training the set of coefficients for the first of the plurality of output bands comprising
initializing the set of coefficients for the first of the plurality of output bands,
sampling the first of the plurality of downconverted output bands to produce a first sampled band,
time aligning the first sampled band with a first of the plurality of baseband input signals to produce a first time aligned signal,
calculating an error signal between the first time aligned signal and first of the plurality of baseband input signals,
updating the set of coefficients to reduce a magnitude of the error signal, and
repeat training the set of coefficients for a first of a plurality of output bands until the set of coefficients converge to a final solution within an error bound; and
training sets of coefficients for remaining ones of the plurality of output bands.

23. The method of claim 22, wherein:
initializing the set of coefficients comprises initialing coefficients $\phi_{j,q,k}$ to:

$$\varphi_{j,q,k} = \begin{cases} 1, & \text{if } j = 1, q = k = 0 \\ 0, & \text{otherwise,} \end{cases}$$

where j is a coefficient type, q is a non-linearity order, and k is a linear delay;
calculating the error signal comprises
calculating a vector b, wherein:

$$b = [x_{bnd}(0) - adj(0) \ldots x_{bnd}(N-1) - adj(N-1)] = [b(0) \ldots b(N-1)]^T,$$

where $x_{bnd}(n)$ is the first of the plurality of baseband input signals, adj(n) is the first time aligned signal and N is a total number of baseband error samples calculated per capture and T is a transpose operator; and
updating the set of coefficients comprises forming a matrix A such that $A\gamma = b$, where:

$$A = \begin{bmatrix} x_{bnd}(0) & x_{bnd}(-1) & \ldots & x_{bnd}(0)|x_{bnd}(0)| & \ldots \\ x_{bnd}(1) & x_{bnd}(0) & \ldots & x_{bnd}(1)|x_{bnd}(1)| & \ldots \\ \vdots & \vdots & & \vdots & \\ x_{bnd}(N-1) & x_{bnd}(N-2) & \ldots & x_{bnd}(N-1)|x_{bnd}(N-1)| & \ldots \end{bmatrix},$$

$$\gamma = [\gamma_{1,0,0} \gamma_{1,0,1} \ldots \gamma_{J,Q,K}]^T$$

where $\gamma$ are error coefficient values,
calculating a numerical solution for error coefficient values $\gamma$, by solving $A\gamma = b$, and
updating the set of coefficients as a weighted sum of previous coefficient values and error coefficient values such that $\phi_{n+1} = \phi_n + \mu\gamma$, where $\mu$ is a weighting factor between 0 and 1.

24. The method of claim 23, wherein training the set of coefficients to minimize the plurality of error signals comprises:
training a plurality of sets of coefficients, each of the plurality of sets of coefficients corresponding to input ranges of each of the plurality of baseband input signals, training the plurality of sets of coefficients comprising, defining p coefficient sections such that Section $P \rightarrow |x_{bndA}(n)| \geq LB_{AP}$ AND $|x_{bndA}(n)| < UB_{AP}$ AND $|x_{bndB}(n)| \geq LB_{BP}$ AND $|x_{bndB}(n)| < UB_{BP}$, where $LB_{AP}$, $UB_{AP}$, $LB_{BP}$ and $UB_{BP}$ are thresholds that define the regions of Section P.
forming A' and b' by selecting rows of A and b corresponding to coefficients pertaining to the one of a plurality of coefficient sections,
calculating a numerical solution for error coefficient values $\gamma$, by solving $A'\gamma = b'$, and
updating the set of coefficients as a weighted sum of the previous coefficient values and error coefficient values such that $\phi_{n+1} = \phi_n + \mu\gamma$.

25. The method of claim 20, wherein the circuit comprises an amplifier.

* * * * *